United States Patent [19]
Ryan

[11] Patent Number: 5,599,737
[45] Date of Patent: Feb. 4, 1997

[54] CONDUCTIVE RUNNER FABRICATION

[75] Inventor: Vivian W. Ryan, Washington, N.J.

[73] Assignee: Lucent Technologies Inc., Murray Hill, N.J.

[21] Appl. No.: 367,380

[22] Filed: Dec. 30, 1994

[51] Int. Cl.$^6$ ............................................. H01L 21/283
[52] U.S. Cl. ........................ 437/187; 437/192; 437/194; 437/197; 437/957
[58] Field of Search ..................... 437/190, 192, 437/194, 197, 187, 957

[56] References Cited

U.S. PATENT DOCUMENTS

| | | | |
|---|---|---|---|
| 5,057,455 | 10/1991 | Foo et al. | 437/193 |
| 5,141,897 | 8/1992 | Manocha et al. | 437/228 |
| 5,202,274 | 4/1993 | Bae et al. | 437/40 |
| 5,272,110 | 12/1993 | Koyama | 437/190 |
| 5,278,448 | 1/1994 | Fujii | 437/192 |

FOREIGN PATENT DOCUMENTS 4-354337  12/1992  Japan.

OTHER PUBLICATIONS

Wolf, S., Silicon Processing, Lattice Press, vol. 2, 1990, pp. 124–133, 180–191.
Wolf, S., Silicon Processing, Lattice Press, vol. 2, 1990, pp. 191, 199–207.

*Primary Examiner*—T. N. Quach
*Attorney, Agent, or Firm*—John T. Rehberg

[57] ABSTRACT

The method of forming runners having superior stress migration characteristics is disclosed. A blanket layer of conductive material is deposited over a dielectric. A blanket layer is subjected to a blanket-etch back procedure, thereby reducing its thickness by approximately half. The remaining layer is then patterned to form runners. Resulting runners have a superior grain structure and greater resistance to electromigration and stress migration.

7 Claims, 2 Drawing Sheets

CONDUCTIVE RUNNER FABRICATION

TECHNICAL FIELD

This invention relates to integrated circuits and methods for their fabrication.

BACKGROUND OF THE INVENTION

Modern integrated circuits are often fabricated with several layers of conductors, often termed "runners" Usually the runners are formed by depositing a blanket layer of a conductive material such as aluminum. Then a patterned photoresist is formed over the aluminum layer. Using the patterned photoresist as a mask, a plasma etching process is initiated and the aluminum is patterned. The patterned aluminum may then be covered with a dielectric.

Those concerned with the development of integrated circuits have consistently sought for methods and structures which will improve the electromigration and stress migration properties of aluminum runners.

SUMMARY OF THE INVENTION

The present invention addresses these concerns. Illustratively, the invention includes forming a blanket layer of conductive material overlying a dielectric substrate. Then a blanket etchback procedure is performed to reduce the thickness of the conductive material, thereby producing a second blanket layer of conductive material. Then the second layer of conductive material is patterned to form runners.

DETAILED DESCRIPTION

Figure 1:
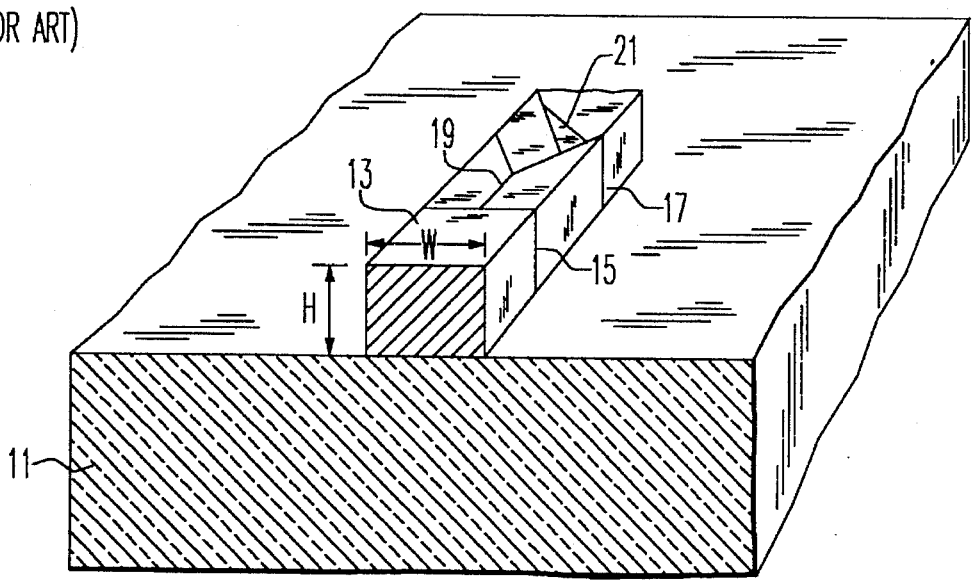
FIG. 1 is a partially perspective, partially cross sectional view of a typical aluminum runner.

In FIG. 1, substrate 11 is a dielectric, typically an oxide of silicon, or a dielectric containing substantial amount of an oxide of silicon. Reference numeral 13 denotes a runner formed according to conventional techniques. Reference numerals 15, 17, and 19 denote some of the grain boundaries in runner 13. It has been observed that runners which have grain boundaries that extend along the principal axis of the runner (such as grain boundaries 19) tend to be susceptible to stress migration failures. Furthermore, runners 13 formed by conventional techniques often have small randomly located grains, such as that denoted by reference numeral 21.

Applicant has discovered that the resistance of runners to stress migration, and possibly electromigration can be improved if the runner has a more bamboo-like structure. Applicant has discovered that it is desirable to minimize or reduce the number of grain boundaries which have a directional component along the axis of the runner (such as grain boundary 19) and also to reduce the number of small grains such as that indicated by reference numeral 21.

Runner 13 has a width denoted by w; and height denoted by h.

Figure 2:
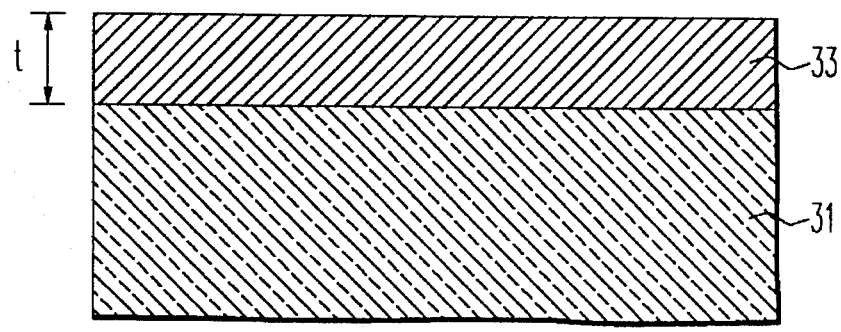
FIGS. 2–5 are cross sectional views useful in understanding an illustrative embodiment of the present invention.

Applicant's process may be understood by reference to FIGS. 2–5. In FIG. 2 reference numeral 31 denotes a substrate which, typically, may be an oxide of silicon or contain a substantial amount of an oxide of silicon. Desirably, substrate 31 is smoothed or planarized. Metal layer 33 is formed on top of dielectric 31 desirably, by sputtering, although evaporation or other deposition techniques may also be used. The thickness, t, of layer 33 is desirably made to be approximately twice the width of the final desired narrowest runner. The grain size of layer 33 is generally proportional to thickness and the density of small grains decreases significantly with increasing deposited—film thickness, t. The grain size of the patterned runner is generally proportional to the twice the width of the completed, patterned runner with greatly reduced numbers of small grains, thereby producing a uniform bamboo-like structure.

Figure 3:
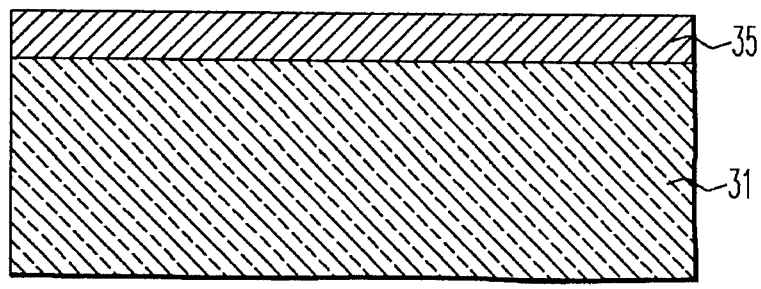
Figure 4:
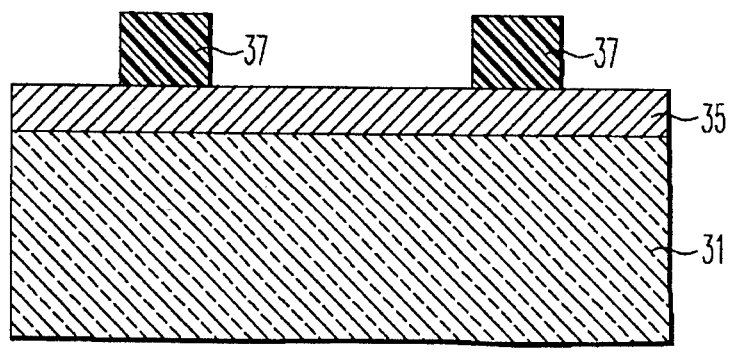

Turning to FIG. 3, aluminum layer 33 has been etched back. Typically, approximately 50% of the thickness t, of aluminum runner 33 has been removed. A blanket etch back of aluminum layer 33 may be performed by using a dry etching procedure well known to those skill in the art. Alternatively, the upper half of layer 33 may be anodized, converting it to an oxide. The aluminum oxide is removed in a chemical bath containing phosphoric acid and other etchants such as chromic acid known to those of skill of the art. After a blanket etch back has been performed to produce layer 35, patterned photoresist 37 (FIG. 4) is formed on top of layer 35.

Figure 5:
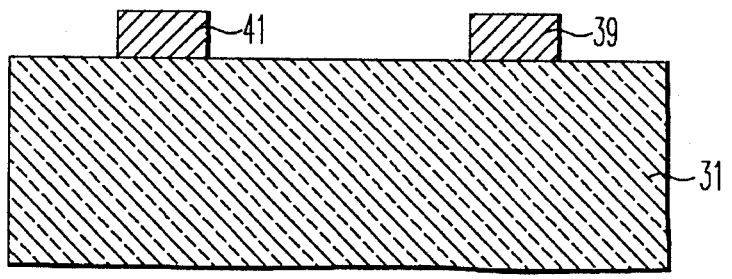

Turning to FIG. 5, a dry etching process known to those skill in the art is performed to produce patterned runners 41 and 39.

Figure 6:
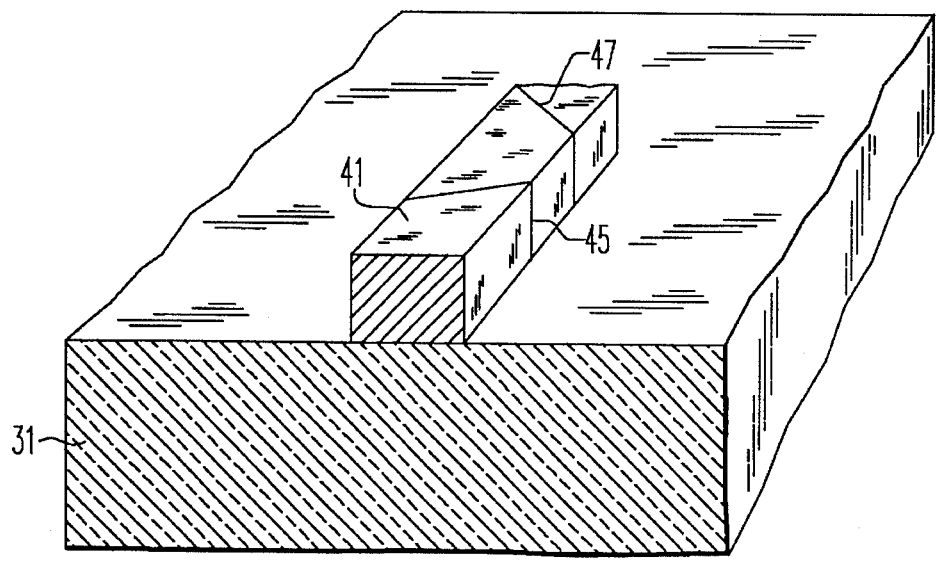
FIG. 6 is a partially, perspective partially cross sectional view of an illustrative embodiment of the present invention.

Turning to FIG. 6, a portion of patterned runner 41 is illustrated. Reference numeral 45 and 47 denote grain boundaries. It will be noted that small grains, such as that designated by reference numeral 21 in FIG. 1 and grains having grain boundaries with components parallel to the long axis of the runner (such as that designated by reference numeral 19 in FIG. 1) generally absent. Thus, runner 41 exhibits greater resistance to stress migration and electromigration.

The inventive technique may be applied to form aluminum runners. It may also be implored to form aluminum runners from Al—Cu and or Al—Cu—Si. Furthermore, the inventive technique may also be used to form runners containing principally copper or principally silver. The inventive technique may be applied to metal runners formed over conductive underlayers, such as patterned aluminum over TiN and/or Ti and/or a refractory metal silicide. The underlying conductive layer may be patterned together with the aluminum or in a subsequent step.

I claim:

1. A method of forming an integrated circuit comprising:

forming a blanket layer of conductive material overlying a dielectric substrate; and then without performing a heat treatment to increase average grain size, performing a blanket etchback procedure to reduce the thickness of said conductive material by approximately 50%, thereby producing a second blanket layer of conductive material;

patterning said second layer of conductive material to form conductive runners.

2. The method of claim 1 in which one or more material layers are formed between said blanket layer of conductive material and said substrate.

3. The method of claim 2 in which said material layer is chosen from the group consisting of TiN, Ti, and refractory metal silicides.

4. The method of claim 1 in which said conductive material is chosen from the group consisting of Al, Al—Cu, Al—Cu—Si, Ag, and Cu.

5. The method of claim 1 in which said thickness is reduced by anodizing a portion of said conductive material and then wet-etching said anodized portion away.

6. The method of claim 1 in which said thickness is reduced by dry etching.

7. The method of claim 1 in which said dielectric is smoothed or planarized.

* * * * *